(12) United States Patent
Yuan et al.

(10) Patent No.: US 10,629,766 B2
(45) Date of Patent: Apr. 21, 2020

(54) METHOD FOR MANUFACTURING ULTRAVIOLET PHOTODETECTOR BASED ON GA2O3 MATERIAL

(71) Applicant: Xidian University, Xi'an (CN)

(72) Inventors: Lei Yuan, Xi'an (CN); Renxu Jia, Xi'an (CN); Hongpeng Zhang, Xi'an (CN); Yuming Zhang, Xi'an (CN)

(73) Assignee: XIDIAN UNIVERSITY, Xi'an (CN)

( * ) Notice: Subject to any disclaimer, the term of this patent is extended or adjusted under 35 U.S.C. 154(b) by 0 days.

(21) Appl. No.: 16/119,067

(22) Filed: Aug. 31, 2018

(65) Prior Publication Data

US 2018/0374980 A1   Dec. 27, 2018

Related U.S. Application Data

(63) Continuation of application No. PCT/CN2017/114675, filed on Dec. 5, 2017.

(30) Foreign Application Priority Data

Dec. 8, 2016 (CN) .......................... 2016 1 1124461
Dec. 8, 2016 (CN) .......................... 2016 1 1124463

(51) Int. Cl.
*H01L 31/107* (2006.01)
*H01L 31/0224* (2006.01)
(Continued)

(52) U.S. Cl.
CPC .... *H01L 31/1075* (2013.01); *H01L 21/02414* (2013.01); *H01L 21/02433* (2013.01); *H01L 21/02483* (2013.01); *H01L 21/02565* (2013.01); *H01L 21/02576* (2013.01); *H01L 21/02579* (2013.01); *H01L 21/02658* (2013.01); *H01L 31/022408* (2013.01); *H01L 31/032* (2013.01); *H01L 31/0312* (2013.01); *H01L 31/0336* (2013.01); *H01L 31/03044* (2013.01);
(Continued)

(58) Field of Classification Search
None
See application file for complete search history.

(56) References Cited

U.S. PATENT DOCUMENTS

| | | | |
|---|---|---|---|
| 2011/0041980 A1* | 2/2011 | Kim | H01L 51/441 156/60 |
| 2012/0292162 A1* | 11/2012 | Jeong | G06F 3/045 200/181 |

FOREIGN PATENT DOCUMENTS

| | | | | |
|---|---|---|---|---|
| WO | WO-2009066667 A1 * | 5/2009 | | G01J 1/429 |
| WO | WO-2009157512 A1 * | 12/2009 | | G02B 6/4202 |

* cited by examiner

*Primary Examiner* — Michelle Mandala
(74) *Attorney, Agent, or Firm* — WPAT, PC

(57) ABSTRACT

A method for manufacturing an ultraviolet photodetector based on $Ga_2O_3$ material are provided. The method includes: selecting a substrate; forming a $Ga_2O_3$ layer on an upper surface of the substrate; forming a top electrode on the $Ga_2O_3$ layer; and forming a bottom electrode on a lower surface of the substrate. $Ga_2O_3$ material is adopted, with a light transmittance in the solar blind area can reach 80% or even 90%. The $Ga_2O_3$ material is suitable for application to a light absorbing layer, and its transparent conductive electrical properties are also beneficial to improve the light absorption capacity of the light absorbing layer, thereby greatly improving the device performance of the photodetector diode.

12 Claims, 10 Drawing Sheets

(51) Int. Cl.
  *H01L 31/0304* (2006.01)
  *H01L 31/0312* (2006.01)
  *H01L 31/0336* (2006.01)
  *H01L 31/18* (2006.01)
  *H01L 31/032* (2006.01)
  *H01L 31/11* (2006.01)
  *H01L 21/02* (2006.01)
  *C23C 16/40* (2006.01)
  *C23C 14/08* (2006.01)
  *C23C 14/35* (2006.01)
(52) U.S. Cl.
  CPC ............ *H01L 31/107* (2013.01); *H01L 31/11* (2013.01); *H01L 31/1864* (2013.01); *C23C 14/08* (2013.01); *C23C 14/35* (2013.01); *C23C 16/40* (2013.01); *H01L 21/0262* (2013.01); *H01L 21/02378* (2013.01); *H01L 21/02458* (2013.01); *H01L 21/02505* (2013.01); *H01L 21/02631* (2013.01); *Y02P 70/521* (2015.11)

METHOD FOR MANUFACTURING ULTRAVIOLET PHOTODETECTOR BASED ON GA2O3 MATERIAL

FIELD OF THE DISCLOSURE

The disclosure relates to integrated circuits technical field, and more particularly to a method for manufacturing an ultraviolet photodetector based on $Ga_2O_3$ material.

BACKGROUND

With the deepening of research and exploration in the fields of astronomy, high-energy physics, space technology, etc., and the rapid expansion of its application prospects in space exploration and satellites, the requirements for light detectors, especially ultraviolet light detectors are becoming higher, such as in the optoelectronic countermeasures, the ultraviolet countermeasure and the counter-countermeasures technology have become more and more concerned by the military. Generally, electromagnetic waves with a wavelength of 10-400 nm are ultraviolet rays, which are different from visible radiation and infrared radiation. The spectral region of the ultraviolet rays from solar radiation that is almost completely absorbed by the atmosphere is called a solar blind zone, which is an area that is difficult to detect in UV detection.

Avalanche Photo Diode (APD) detectors and photodetection diodes are both PN junction-type photodetection diodes that use the avalanche multiplication effect of carriers to amplify optical signals to improve detection sensitivity. APD detectors generally can measure from ultraviolet light region to infrared light region, and has great use value in the development of military high technology and civilian products market, for example, making a real-time detection or effective tracking of flying targets that can release a large amount of ultraviolet radiation in tail smoke or plume in the solar blind area.

As current APD detectors do not have extremely high pressure resistance and puncture resistance and are not suitable for applications in extreme environments such as high frequency, high radiation, high temperature and high pressure. In addition, photodetection diodes still have problems, such as weak light absorption capability and weak ability in ultraviolet light detection.

SUMMARY

Therefore, the present disclosure provides a method for manufacturing an ultraviolet photodetector based on $Ga_2O_3$ material, which can greatly improve the device performance of the ultraviolet photodetector diode.

Specifically, an embodiment of the present disclosure provides a method for manufacturing an ultraviolet photodetector based on $Ga_2O_3$ material, which includes: selecting a substrate;
forming a $Ga_2O_3$ layer on an upper surface of the substrate;
forming a top electrode on the $Ga_2O_3$ layer; and
forming a bottom electrode on a lower surface of the substrate.

An embodiment of the disclosure provides a method for manufacturing a photodetector diode based on double heterojunction $Ga_2O_3$/GaN/SiC. The method includes: selecting a SiC substrate;
growing continuously a homoepitaxial layer, a GaN layer and a $Ga_2O_3$ layer on a surface of the SiC substrate; forming a light absorbing layer on a surface of the $Ga_2O_3$ layer;
depositing a first metal material on the lower surface of the entire substrate to form a bottom electrode; and
depositing a second metal material on the upper surface of the entire substrate to form a top electrode, thereby forming the photodetector diode.

The disclosure relates to a deep ultraviolet APD detector diode based on $Ir_2O_3$/$Ga_2O_3$ and a method for manufacturing thereof. The method includes:
selecting a β-$Ga_2O_3$ substrate;
growing a β-$Ga_2O_3$ material on a surface of the β-$Ga_2O_3$ substrate to form a homoepitaxial layer;
growing a $Ir_2O_3$ material on a surface of the homoepitaxial layer to form a heteroepitaxial layer;
etching the heteroepitaxial layer and the homoepitaxial layer to form a trapezoid structure;
forming a top electrode on a surface of the heteroepitaxial layer; and
forming a bottom electrode on the lower surface of the β-$Ga_2O_3$ substrate, thereby forming an APD detector diode.

The photodetector of the embodiments of the disclosure adopts the $Ga_2O_3$ material whose light transmittance in the solar blind area can reach 80% or even 90% and is suitable for the light absorbing layer, and its transparent conductive electrical properties are also beneficial to improve the light absorption capacity of the light absorbing layer, thereby greatly improving the device performance of the photodetector diode.

The above description is merely an overview of the technical solutions of the present disclosure, so that the technical means of the present disclosure can be more clearly understood, and can be implemented according to the contents of the specification. Also, for making the above and other objects, features, and advantages of the present disclosure more apparent and understood, preferred embodiments will be described with reference to the following detailed description hereinafter.

DETAILED DESCRIPTION OF PREFERRED EMBODIMENTS

In order to further explain the technical means and efficacy of the present disclosure for achieving the intended purpose of the disclosure, the specific embodiments, methods, steps and effects of the preparation method of an ultraviolet photodetector based on $Ga_2O_3$ material according to an embodiment of the present disclosure will be described in detail below with reference to the accompanying drawings and preferred embodiments.

The foregoing and other objects, features, and advantages of the disclosure will be apparent from the detailed description of preferred embodiments with reference to the accompanying drawings. The technical means and functions of the present disclosure for achieving the intended purpose can be more deeply and specifically understood by the description of the embodiments. However, the drawings are only for reference and description, and are not intended to be used for limiting the present disclosure.

Figure 1:
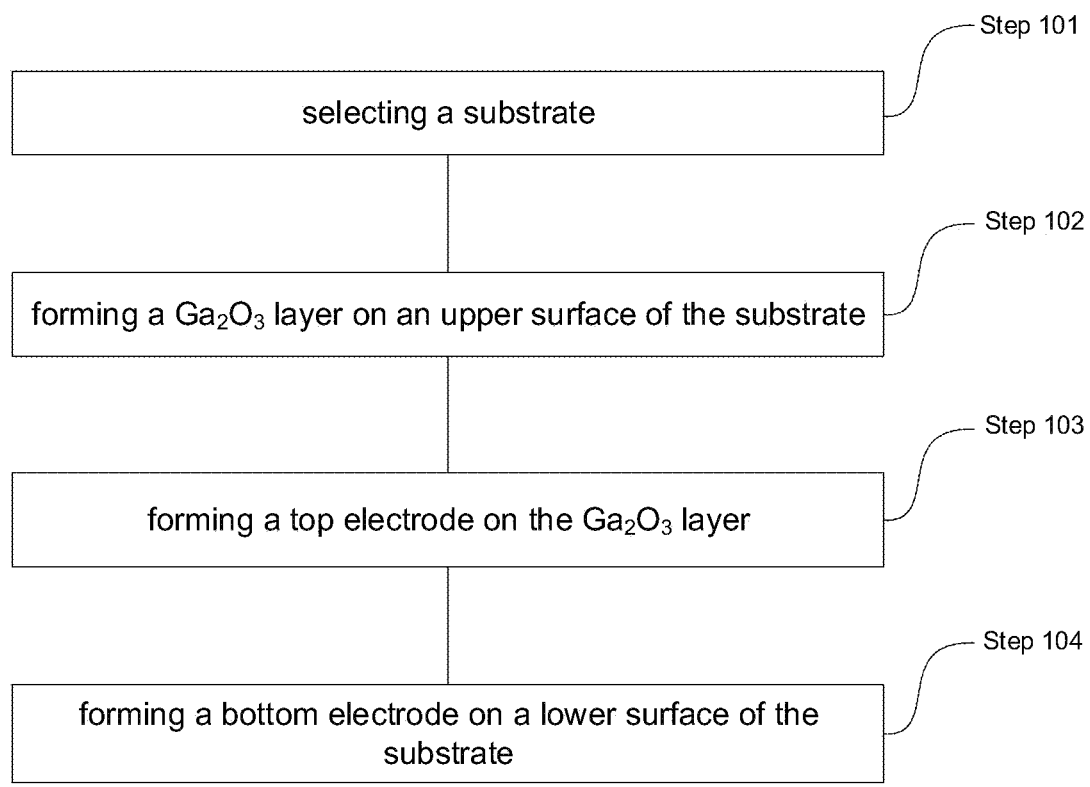
FIG. 1 is a schematic flowchart of a method for manufacturing an ultraviolet photodetector based on $Ga_2O_3$ material according to an embodiment of the present disclosure.

Please refer to FIG. 1, FIG. 1 is a schematic flowchart of a method for manufacturing an ultraviolet photodetector based on $Ga_2O_3$ material according to an embodiment of the present disclosure. The method can include the following steps.

Step 101, selecting a substrate.

Step 102, forming a $Ga_2O_3$ layer on an upper surface of the substrate.

Step 103, forming a top electrode on the $Ga_2O_3$ layer.

Step 104, forming a bottom electrode on the lower surface of the substrate.

In this embodiment of the disclosure, $Ga_2O_3$ material is adopted, with a light transmittance in the solar blind area can reach 80% or even 90%. The $Ga_2O_3$ material is suitable for application to a light absorbing layer, and its transparent conductive electrical properties are also beneficial to improve the light absorption capacity of the light absorbing layer, thereby greatly improving the device performance of the photodetector diode.

The ultraviolet photodetectors based on $Ga_2O_3$ material may include two structures: a deep ultraviolet APD detecting diode based on $Ir_2O_3/Ga_2O_3$ and a photodetector diode based on double heterojunction $Ga_2O_3/GaN/SiC$. The following focuses on the detailed description of the two types of ultraviolet photodetectors.

Embodiment 1

Figure 2:
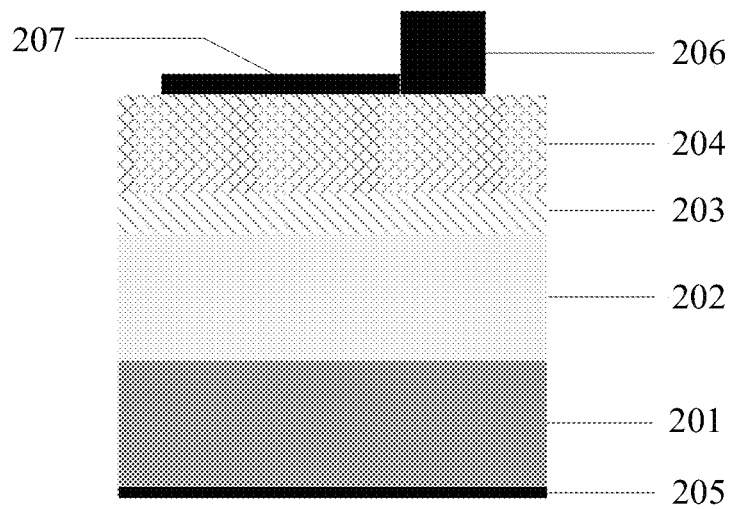
FIG. 2 is a schematic cross-sectional view of a photodetector diode based on double heterojunction Ga2O3/GaN/SiC according to an embodiment of the present disclosure.
Figure 3:
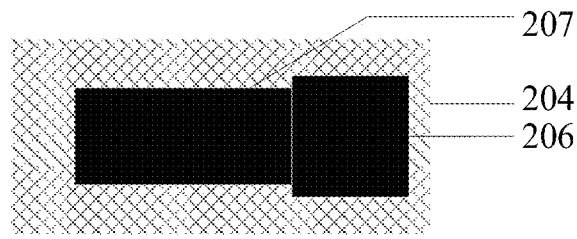
FIG. 3 is a schematic top view of a photodetector diode based on double heterojunction Ga2O3/GaN/SiC according to an embodiment of the present disclosure.

Referring to FIG. 2 and FIG. 3, FIG. 2 is a schematic cross-sectional view of a photodetector diode based on double heterojunction $Ga_2O_3/GaN/SiC$ according to an embodiment of the present disclosure; FIG. 3 is a schematic top view of a photodetector diode based on double heterojunction $Ga_2O_3/GaN/SiC$ according to an embodiment of the present disclosure. The ultraviolet photodetector diode of the present embodiment includes a SiC substrate 201, an N-type homoepitaxial layer 202, a GaN layer 203, an N-type $Ga_2O_3$ layer 204, a bottom electrode 205, a top electrode 206, and a light absorbing layer 207.

Wherein, the SiC substrate 201 is formed with N-type 4H-SiC or N-type 6H-SiC material; the N-type homoepitaxial layer 202 is formed with N-doped SiC with doping concentration of the order of $10^{15}$ cm$^{-3}$; the GaN layer 203 is formed with N-doped P-type GaN with a doping concentration of the order of $10^{17}$ cm$^{-3}$; the N-type $Ga_2O_3$ layer 204 is formed with $\beta$-$Ga_2O_3$ (−201), $\beta$-$Ga_2O_3$ (010) or $\beta$-$Ga_2O_3$ (001) material doped with Sn, Si, Al, which has a doping concentration on the order of $10^{17}$ cm$^{-3}$; and the light absorbing layer 207 is formed with Ti, Al, Ni or the like material.

Further, the top electrode 206 may be formed with metal materials such as Au, Al, Ti, Sn, Ge, In, Ni, Co, Pt, W, Mo, Cr, Cu, Pb, or an alloy with two or more of these metal materials, or may be formed with conductive compounds such as ITO. Further, the top electrode 206 may be a two-layer structure composed of two or more different metals, for example, Al/Ti. The bottom electrode 205 may be formed with metal materials such as Au, Al, Ti, Sn, Ge, In, Ni, Co, Pt, W, Mo, Cr, Cu, Pb, or an alloy with two or more of these metals, or may be formed with conductive compounds such as ITO. Further, the bottom electrode 205 may be a two-layer structure composed of two or more different metals, for example, an Al/Ti laminated bimetal material.

It should be noted that the wide bandgap semiconductor material $Ga_2O_3$ is especially suitable for photodetection of deep ultraviolet solar blind area since the light transmittance of the $Ga_2O_3$ material in the solar blind area can reach 80% or even more than 90%. The $Ga_2O_3$ material has high photoelectric sensitivity and combines the transparency of sapphire with the conductivity of SiC. It is an ideal material for the study of photodetector diode.

Figure 4:
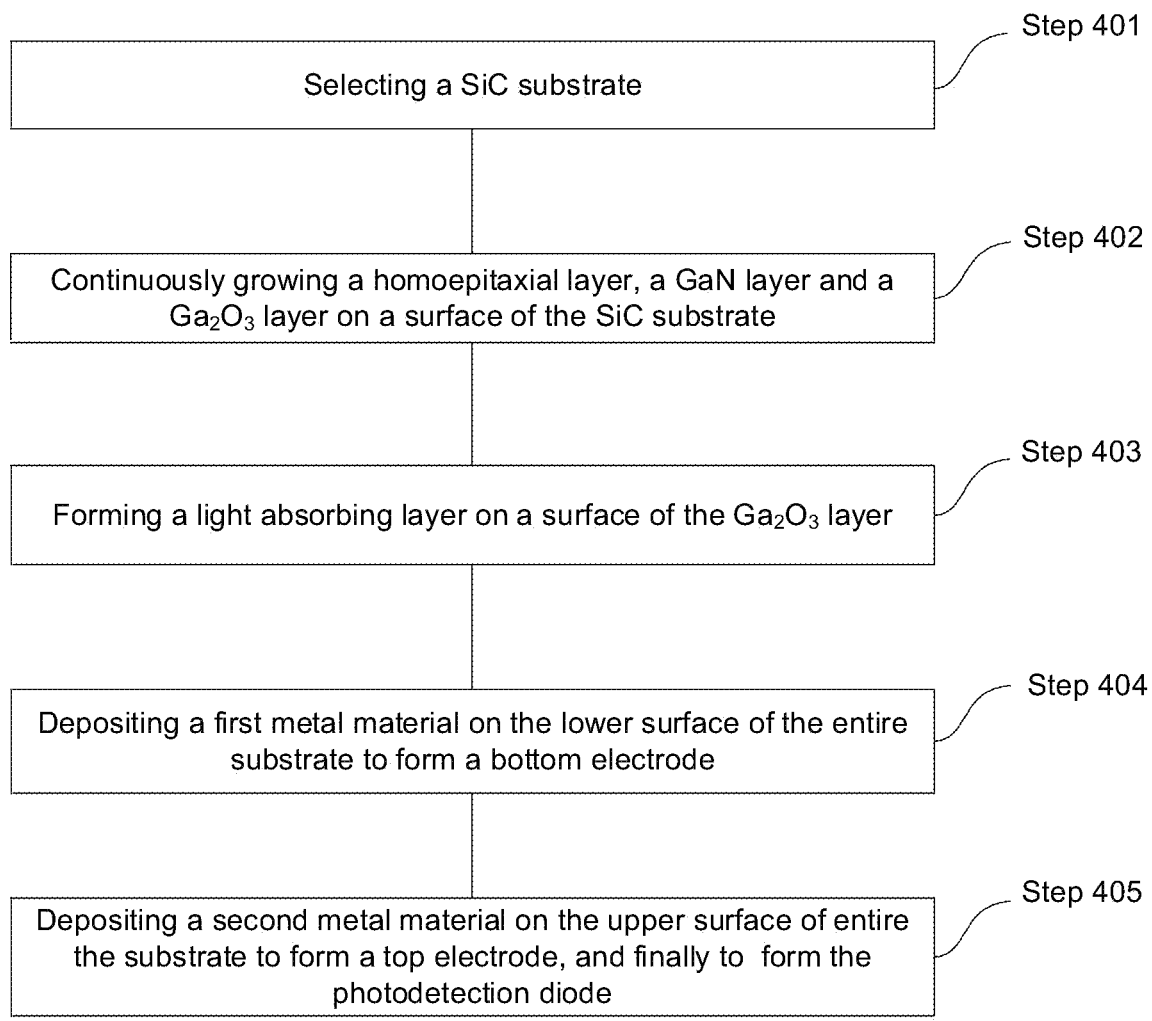
FIG. 4 is a schematic flowchart of a method for manufacturing a photodetector diode based on double heterojunction $Ga_2O_3$/GaN/SiC according to an embodiment of the present disclosure.

Referring to FIG. 4, FIG. 4 is a schematic flowchart of a method for manufacturing a photodetector diode based on double heterojunction $Ga_2O_3/GaN/SiC$ according to an embodiment of the present disclosure. The method includes the following steps.

Step 401, selecting a SiC substrate.

Step 402, continuously growing a homoepitaxial layer, a GaN layer and a Ga2O3 layer on a surface of the SiC substrate.

Step 403, forming a light absorbing layer on a surface of the Ga2O3 layer;

Step 404, depositing a first metal material on a lower surface of the entire substrate to form a bottom electrode.

Step 405, depositing a second metal material on the upper surface of entire the substrate to form a top electrode, and thereby finally forming the photodetector diode.

Wherein, the step 401 can include:

step 4011, selecting an N-type 4H-SiC or N-type 6H-SiC material as the SiC substrate; and step 4012: cleaning the SiC substrate according to a RCA standard cleaning process.

The step 402 can include:

step 4021: growing an N-doped SiC material on the surface of the SiC substrate by an LPCVD process to form an N-type homoepitaxial layer;

step 4022: growing an N-doped GaN material on the surface of the homoepitaxial layer by an MOCVD process to form a GaN layer; and Step 4023: growing a β-$Ga_2O_3$ layer material with a doping element of Sn, Si, Al or the like materials on a surface of the GaN layer by a MBE process to form a β-$Ga_2O_3$ layer.

The step 403 can include: via a first mask, a third metal material is sputtered on a surface of the $Ga_2O_3$ layer by a magnetron sputtering process to form a light absorbing layer. Specifically, Ni material is used as a sputtering target, and Ar is used as the sputtering gas to fill into the sputtering cavity; and then Ni material is sputtered on the surface of the $Ga_2O_3$ layer as a third metal material, under the conditions that an operating power is 100 W and a vacuum degree is $6 \times 10^{-4}$-$1.3 \times 10^{-3}$ Pa.

The step 404 can include:

step 4041: sputtering a first metal material on the lower surface of the entire substrate, which includes the SiC substrate, the homoepitaxial layer, the GaN layer, the $Ga_2O_3$ layer, and the light absorbing layer, by a magnetron sputtering process; and step 4042: under the atmosphere of N2 and Ar, forming an ohmic contact between the lower surface of the entire substrate and a surface of the first metal material, by a rapid thermal annealing process, to complete the preparation of the bottom electrode.

Further, the step 4041 may include: using Ni as a target, and using Ar as a sputtering gas to fill into the sputtering cavity, then sputtering Ni on the lower surface of the entire substrate as the first metal material under the condition of a working power of 100 W and a vacuum degree of $6 \times 10^{-4}$-$1.3 \times 10^{-3}$ Pa.

The step 405 can include:

step 4051: using a second mask, growing a second metal material on the upper surface of the entire substrate, which includes the SiC substrate, the homoepitaxial layer, the GaN layer, the $Ga_2O_3$ layer and the light absorbing layer, by a magnetron sputtering process; and step 4052: under the atmosphere of $N_2$ and Ar, forming an ohmic contact between the upper surface of the entire substrate and a surface of the second metal material, by a rapid thermal annealing process, to complete the preparation of the bottom electrode.

It is important to emphasize that the process order of the bottom electrode and the top electrode in steps 404 and 405 is not limited. The preparation of the bottom electrode may be performed first, or the preparation of the top electrode may be performed first, and no limitation is imposed here.

The photodetector diode of the present embodiment adopts a double heterojunction structure, thereby forming a double barrier structure, which can effectively reduce leakage current, and greatly improve the device reliability of the photodiode. The disclosure has high practicability. At present, the process of growth of homoepitaxial layer and GaN layer on the SiC substrate has matured, and a mature process of growing $Ga_2O_3$ on the GaN substrate has also appeared. The present disclosure combines the two processes and has high practical value.

In addition, the photodetector diode of the present disclosure applies the $Ga_2O_3$ material to the light absorbing layer, and fully exerts its excellent performance in ultraviolet light detection. The light transmittance in the solar blind area of the $Ga_2O_3$ material can reach 80% or even 90%. It is suitable for the light absorbing layer, and its transparent conductive electrical properties are also beneficial to improve the light absorption capacity of the light absorbing layer, thereby greatly improving the device performance of the photodetector diode.

Figure 5A:
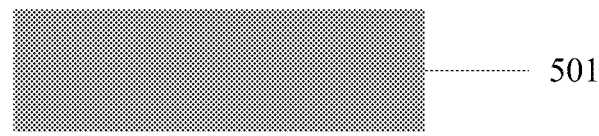
FIG. 5a-FIG. 5g are schematic diagrams showing processes of a method for manufacturing a photodetector diode based on double heterojunction $Ga_2O_3$/GaN/SiC according to an embodiment of the present disclosure.
Figure 5B:
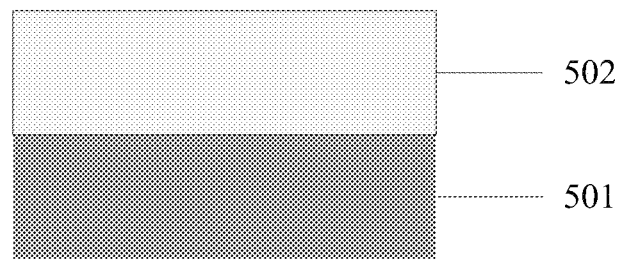
Figure 5C:
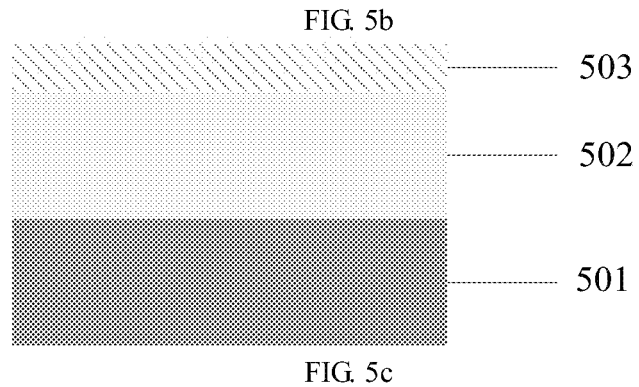
Figure 5D:
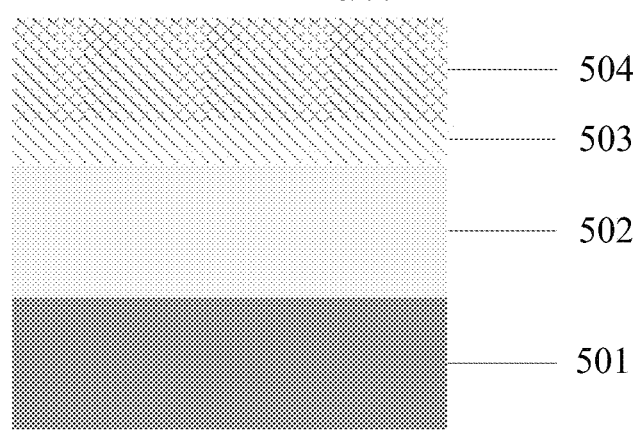
Figure 5E:
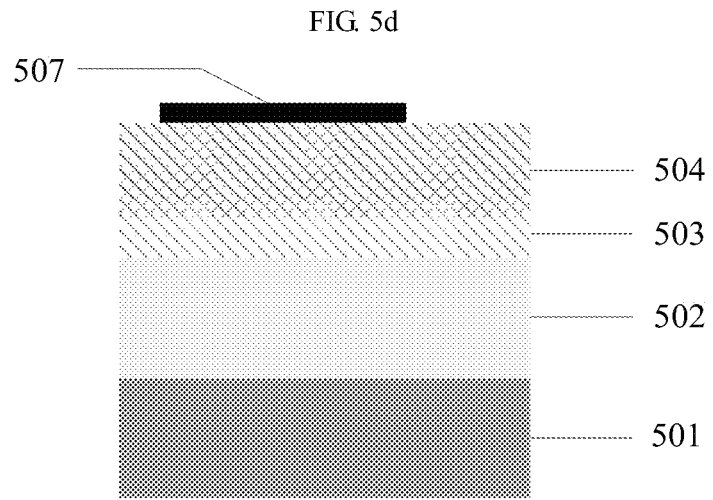
Figure 5F:
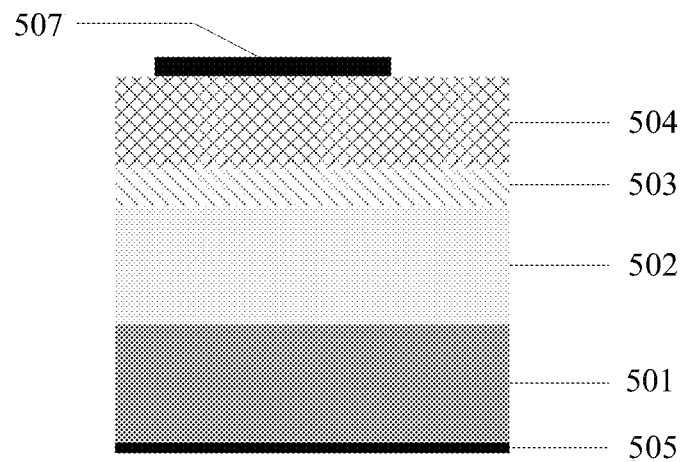
Figure 5G:
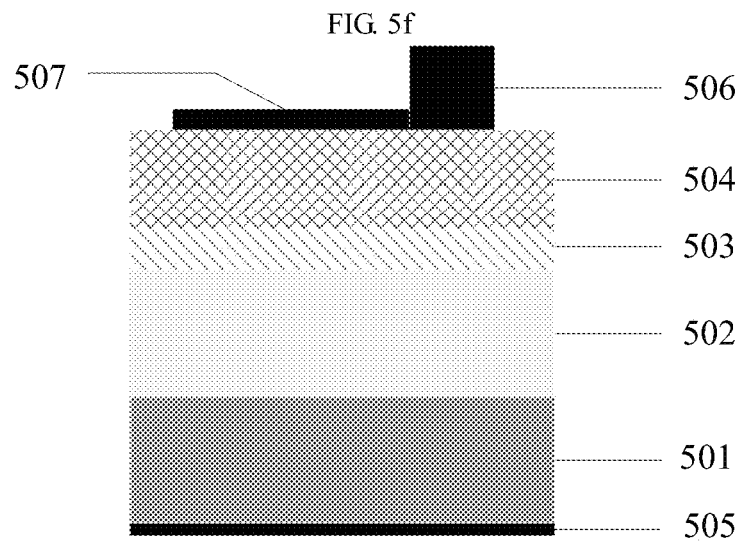
Figure 6A:
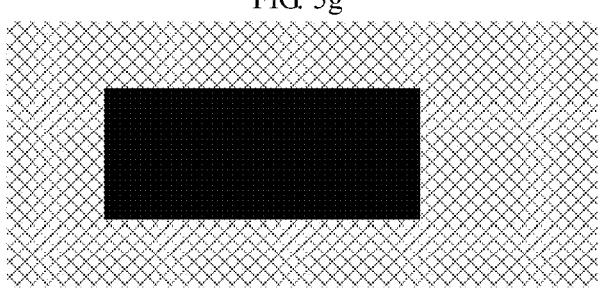
FIG. 6a is a schematic structural diagram of a first mask according to an embodiment of the present disclosure.
Figure 6B:
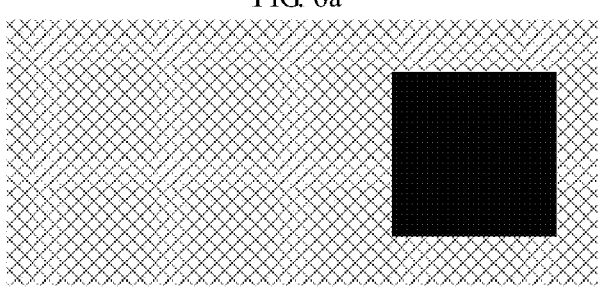
FIG. 6b is a schematic structural diagram of a second mask according to an embodiment of the present disclosure.

Referring to FIG. 5a-FIG. 5g, FIG. 6a, and FIG. 6b, FIG. 5a-FIG. 5g are schematic diagrams showing processes of a method for manufacturing a photodetector diode based on double heterojunction $Ga_2O_3$/GaN/SiC, according to an embodiment of the present disclosure, FIG. 6a is a schematic structural diagram of a first mask according to an embodiment of the present disclosure, and FIG. 6b is a schematic structural diagram of a second mask according to an embodiment of the present disclosure. Based on the above embodiments, this embodiment details a preparation method of a photodetector diode based on double heterojunction $Ga_2O_3$/GaN/SiC according to the present disclosure, as follows.

Step 501: referring to FIG. 5a, a SiC substrate 501 with a thickness of 350 μm is prepared, and is cleaned according to the RCA standard.

Step 502: referring to FIG. 5b, an N-type homoepitaxial layer 502 is formed on the SiC substrate 501 prepared in step 501 by LPCVD, wherein the doping concentration of the N-type homoepitaxial layer 502 is on the order of $10^{15}$ $cm^{-3}$, the doping element is N, and the thickness is 5-10 um.

Step 503: referring to FIG. 5c, a GaN layer 503 is formed on the N-type homoepitaxial layer 502 prepared in step 502 by MOCVD, wherein the doping concentration of the GaN layer is on the order of $10^{17}$ $cm^{-3}$, the doping element is N, and the thickness is 5-10 um.

Step 504: referring to FIG. 5d, a β-$Ga_2O_3$ layer 504 is grown on the GaN layer 503 prepared in step 503 by the Molecular Beam Epitaxy (MBE) process, wherein the doping concentration of the β-$Ga_2O_3$ layer 504 is on the order of $10^{17}$ $cm^{-3}$, the doping element are elements such as Sn, Si and Al, and the thickness of the β-$Ga_2O_3$ layer 504 is 5-10 um.

Step 505: referring to FIG. 5e and FIG. 6a, a Ni light absorbing layer 507 is formed on the β-$Ga_2O_3$ layer 504 prepared in step 504 by magnetron sputtering, via a first mask.

Ni with a mass percentage >99.99% is used as the sputtering target, and Ar with a mass percentage of 99.999% is used as a sputtering gas filled in the sputtering chamber. Before sputtering, the chamber of the magnetron sputtering apparatus is cleaned with high purity Ar for 5 minutes and then evacuated. A collector Ni is manufactured under the conditions that a vacuum is $6 \times 10^{-4}$-$1.3 \times 10^{-3}$ Pa, an Ar flow rate is 20-30 $cm^3$/s, a target base distance of 10 cm, and an operating power of 100 W. The thickness of the collector Ni is 30-100 nm.

Step 506: referring to FIG. 5f, a Ni bottom electrode 505 is formed on the lower surface of the N-type SiC substrate 501 prepared in step 501, by magnetron sputtering.

Ni with a mass percentage >99.99% is used as the sputtering target, and Ar with a mass percentage of 99.999% is used as a sputtering gas in the sputtering chamber. Before sputtering, the chamber of the magnetron sputtering apparatus is cleaned with high purity Ar for 5 minutes and then evacuated. A collector Ni is manufactured under the conditions that a vacuum is $6 \times 10^{-4}$-$1.3 \times 10^{-3}$ Pa, an Ar flow rate is 20-30 $cm^3$/s, a target base distance of 10 cm, and an operating power of 100 W. The thickness of the collector Ni is 150-250 nm. Then, the collector is rapid thermal annealed under $N_2$ or Ar at 1000° C. for 3 min.

Step 507: referring to FIG. 5g and FIG. 6b, a Ni/Au top electrode 506 is formed on the light absorbing layer 507 and the Ga$_2$O$_3$ layer 504 prepared in step 505 by magnetron sputtering, via a second mask.

Ni with a mass percentage >99.99% is used as the sputtering target, and Ar with a mass percentage of 99.999% is used as a sputtering gas filled into the sputtering chamber. Before sputtering, the chamber of the magnetron sputtering apparatus is cleaned with high purity Ar for 5 minutes and then evacuated. A top electrode nickel Ni is manufactured under the conditions that a vacuum is $6\times10^{-4}$-$1.3\times10^{-3}$ Pa, an Ar flow rate is 20-30 cm$^3$/s, a target base distance of 10 cm, and an operating power of 20-100 W. The thickness of the collector Ni is 20-30 nm.

Au with a mass percentage >99.99% is used as the sputtering target, and Ar with a mass percentage of 99.999% is used as a sputtering gas in the sputtering chamber. Before sputtering, the chamber of the magnetron sputtering apparatus is cleaned with high purity Ar for 5 minutes and then evacuated. A top electrode nickel Ni is manufactured under the conditions that a vacuum is $6\times10^{-4}$-$1.3\times10^{-3}$ Pa, an Ar flow rate is 20-30 cm$^3$/s, a target base distance of 10 cm, and an operating power of 20-100 W. The thickness of the gate electrode Au is 150-200 nm. Then, the gate electrode Au is annealed under N$_2$ or Ar at 500° C. for 3 min to form an ohmic contact.

The photodetector diode of the disclosure adopts a double heterojunction structure, thereby forming a double barrier structure, which can effectively reduce leakage current, and greatly improve the device reliability of the photodiode. The disclosure has high practicability. At present, the process of growing homoepitaxial layer and GaN layer on the SiC substrate has matured, and a mature process of growing Ga$_2$O$_3$ on the GaN substrate has also appeared. The present disclosure combines the two processes and has high practical value. In addition, the photodetector diode of the present disclosure adopts Ga$_2$O$_3$ material as the light absorbing layer, and fully exerts its excellent performance in ultraviolet light detection. The light transmittance of the Ga$_2$O$_3$ material in the solar blind area can reach 80% or even 90%. It is suitable for the light absorbing layer, and its transparent conductive electrical properties are also beneficial to improve the light absorption capacity of the light absorbing layer, thereby greatly improving the device performance of the photodetector diode.

Embodiment 2

Wide bandgap semiconductor material Ga$_2$O$_3$ is especially suitable for photodetection of deep ultraviolet solar blind area since the light transmittance of the Ga$_2$O$_3$ material in the solar blind area can reach 80% or even more than 90%. The Ga$_2$O$_3$ material has high photoelectric sensitivity and combines the transparency of sapphire with the conductivity of SiC. It is an ideal material for the study of photodetector diode.

Figure 7:
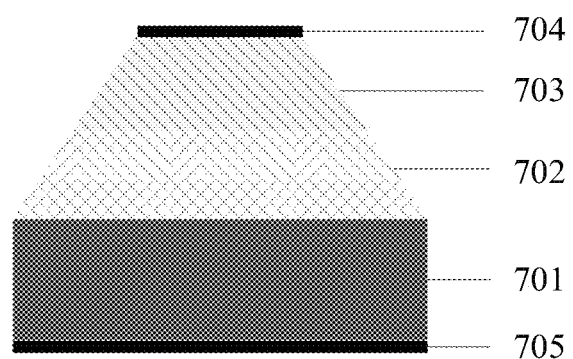
FIG. 7 is a schematic cross-sectional view of a deep ultraviolet APD detecting diode based on $Ir_2O_3$/$Ga_2O_3$ according to an embodiment of the disclosure.
Figure 8:
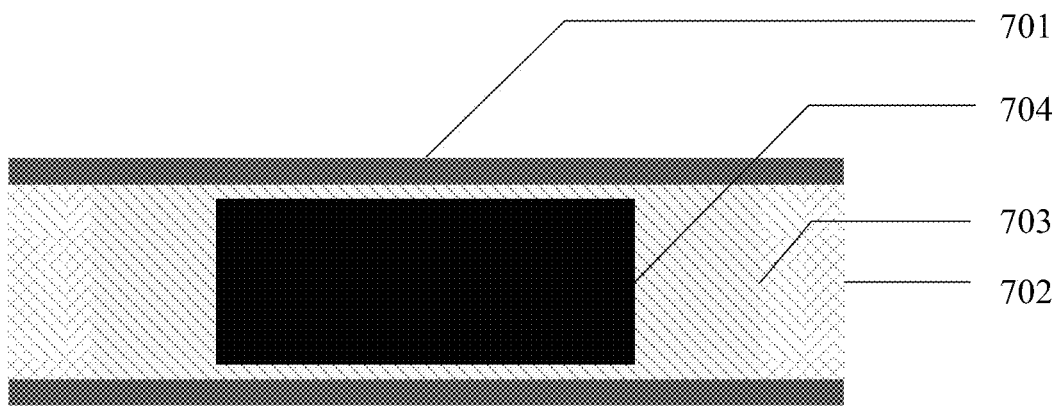
FIG. 8 is a schematic top view of the deep ultraviolet APD detecting diode based on $Ir_2O_3/Ga_2O_3$ according to an embodiment of the present disclosure.

Referring to FIG. 7 and FIG. 8, FIG. 7 is a schematic cross-sectional view of a deep ultraviolet APD detector diode based on Ir$_2$O$_3$/Ga$_2$O$_3$ according to an embodiment of the present disclosure; FIG. 8 is a schematic top view of the deep ultraviolet APD detector diode based on Ir$_2$O$_3$/Ga$_2$O$_3$ according to an embodiment of the present disclosure. The APD detector diode includes a β-Ga$_2$O$_3$ substrate 701, an N-type homoepitaxial layer 702, a P-type heteroepitaxial layer 703, a top electrode 704, and a bottom electrode 705. The β-Ga$_2$O$_3$ substrate 701 is β-Ga$_2$O$_3$ (−201), β-Ga$_2$O$_3$ (010) or Ga$_2$O$_3$ (001) material undoped or doped with Sn, Si, Al; the N-type homoepitaxial layer 702 is β-Ga$_2$O$_3$ layer doped with Sn, Si, Al, and its doping concentration is on the order of $10^{15}$ cm$^{-3}$; the P-type hetero epitaxial layer 703 is Ir$_2$O$_3$ layer, and its doping concentration is on the order of $10^{19}$-$10^{20}$ cm$^3$; the top electrode 704 and the bottom electrode 705 each are a metal material such as Au, Al, Ti, Sn, Ge, In, Ni, Co, Pt, W, Mo, Cr, Cu, or Pb, or an alloy with two or more of above-mentioned metals, or may be electrically conductive compounds such as ITO. Further, the top electrode 704 and the bottom electrode 705 each may be a two-layer structure composed of two or more different above-mentioned metals, such as Al/Ti or Ti/Au.

Figure 9:
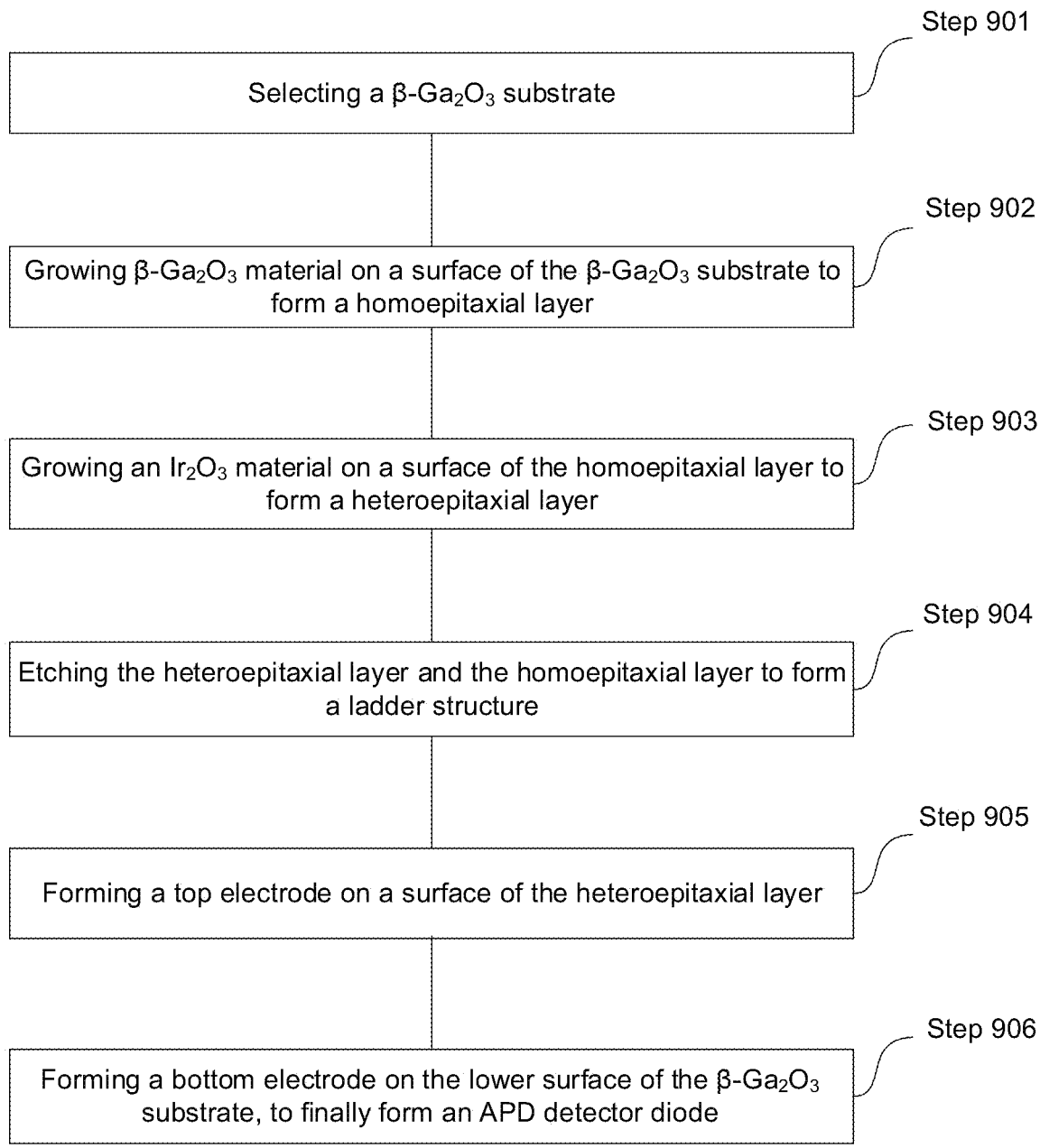
FIG. 9 is a schematic flow chart of a method for manufacturing a deep ultraviolet APD detecting diode based on $Ir_2O_3/Ga_2O_3$ according to an embodiment of the present disclosure.

Referring to FIG. 9, FIG. 9 is a schematic flow chart of a method for manufacturing a deep ultraviolet APD detector diode based on Ir$_2$O$_3$/Ga$_2$O$_3$ according to an embodiment of the present disclosure. The method includes the following steps.

Step 901, selecting a β-Ga$_2$O$_3$ substrate.

Step 902, growing β-Ga$_2$O$_3$ material on a surface of the β-Ga$_2$O$_3$ substrate to form a homoepitaxial layer.

Step 903, growing Ir$_2$O$_3$ material on a surface of the homoepitaxial layer to form a heteroepitaxial layer.

Step 904, etching the heteroepitaxial layer and the homoepitaxial layer to form a trapezoidal structure.

Step 905, forming a top electrode on a surface of the heteroepitaxial layer.

Step 906, forming a bottom electrode on the lower surface of the β-Ga$_2$O$_3$ substrate, thereby finally forming the APD detector diode.

The step 902 may include:

growing N-type β-Ga$_2$O$_3$ material with a doping concentration of $1\times10^{15}$-$1\times10^{16}$ cm$^{-3}$ on the surface of the β-Ga$_2$O$_3$ substrate by a molecular beam epitaxy process to form a homoepitaxial layer, wherein the thickness of the homoepitaxial layer can be adjusted according to avalanche gain factor.

The step 903 may include:

growing P-type Ir$_2$O$_3$ material with a doping concentration of $1\times10^{19}$-$1\times10^{20}$ cm$^{-3}$ on the surface of the homoepitaxial layer by a CVD process to form a heteroepitaxial layer.

The step 904 may include:

step 9041: using a third photolithography mask, etching the heteroepitaxial layer by a tilt etching process to form a first trapezoidal structure in the heteroepitaxial layer; and step 9042: using a fourth photolithography mask, etching the homoepitaxial layer by a selective tilt etching process to form a second trapezoidal structure in the homoepitaxial layer, thereby forming the trapezoidal structure.

The step 905 may include:

using a fifth photolithographic mask, sputtering a first composite metal material on the surface of the heteroepitaxial layer by a magnetron sputtering process to form a top electrode.

Wherein, the step of sputtering a first composite metal material on the surface of the heteroepitaxial layer by a magnetron sputtering process, includes:

sputtering on the surface of the epitaxial layer to form a Ti layer under the conditions that a vacuum is $6\times10^{-4}$-$1.3\times10^{-3}$ Pa and a working power is 100 W, wherein Ti is used as a sputtering target, and Ar is used as a sputtering gas to fill into the sputtering chamber; and sputtering an Au layer on the surface of the Ti layer to form a first composite metal material under the conditions that a vacuum is $6\times10^{-4}$-$1.3\times10^{-3}$ Pa and a working power is 100 W, wherein Ti is used as a sputtering target, and Ar is used as a sputtering gas to fill into the sputtering chamber.

The step 906 may include:
sputtering a second composite metal material on the lower surface of the β-Ga$_2$O$_3$ substrate by a magnetron sputtering process to form a bottom electrode.

Wherein, the step of sputtering a second composite metal material on the lower surface of the β-Ga$_2$O$_3$ substrate by a magnetron sputtering process, includes:
sputtering on a surface of the β-Ga$_2$O$_3$ substrate to form a Ti layer under the conditions that a vacuum is 6×10$^{-4}$-1.3×10$^{-3}$ Pa and a working power is 100 W, wherein Au is used as a sputtering target, and Ar is used as a sputtering gas to fill into the sputtering chamber; and
sputtering an Au layer on a surface of the Ti layer to form a second composite metal material under the conditions that a vacuum is 6×10$^{-4}$-1.3×10$^{-3}$ Pa and a working power is 100 W, wherein Au is used as a sputtering target, and Ar is used as a sputtering gas to fill into the sputtering chamber.

In addition, before the step 902, the method further includes:
step x1, immersing the β-Ga$_2$O$_3$ substrate in methanol, acetone and methanol respectively, and then washing the β-Ga$_2$O$_3$ substrate with deionized water and flowing deionized water, to complete an organic cleaning process; and
step x2, after immersed in the deionized water, immersing the β-Ga$_2$O$_3$ substrate in SPM solution or Piranha solution, and then immersing the β-Ga$_2$O$_3$ substrate in deionized water, and then performing heating and cooling, to complete an acid cleaning process.

In the embodiment of the disclosure, a method for manufacturing a novel ultraviolet APD detector based on Ga$_2$O$_3$ material is proposed for the first time. The disclosure adopts Ga$_2$O$_3$ material and fully exerts the extremely high light transmittance and transparency of the material in the deep ultraviolet light region and the visible light region. The Ga$_2$O$_3$ material has characteristics such as higher band gap width than materials such as SiC and GaN, which ensures that the APD detector has a high withstand voltage and a high breakdown electric field, so that compared with the previous APD detection, the novel ultraviolet APD detector of the present disclosure is more suitable for extreme environments such as high frequency, high radiation and high voltage. The excellent thermal and chemical stability of the material makes the device reliability higher than the previous APD detectors in the high temperature extreme environment, and its detection performance will be better than the previous APD detector.

In addition, the avalanche gain coefficient M can be adjusted by adjusting the thickness of the N/P-type conductive Ga$_2$O$_3$ layer in the structure. An appropriate M is selected to make sure that the disclosure has a good signal-to-noise ratio and has a low excess noise, so that the device achieves optimal photodetection sensitivity.

Figure 10A:
FIG. 10a-10g are schematic diagrams showing processes of a method for manufacturing a deep ultraviolet APD detecting diode based on $Ir_2O_3/Ga_2O_3$ according to an embodiment of the present disclosure.
Figure 10B:
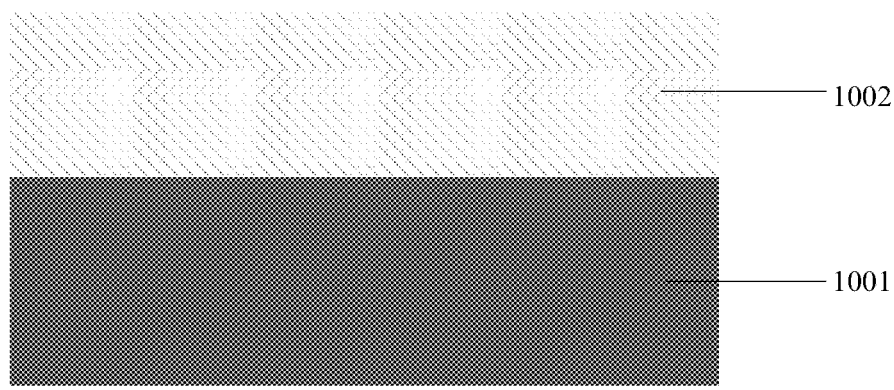
Figure 10C:
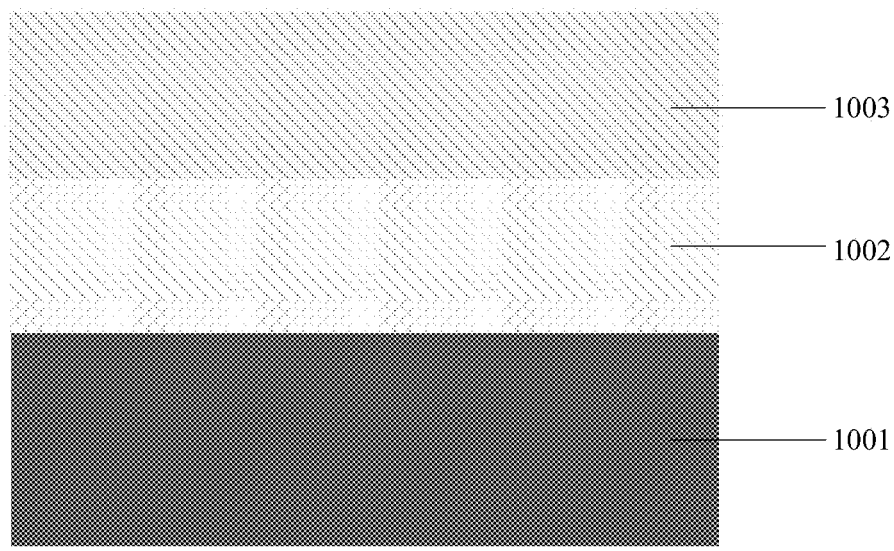
Figure 10D:
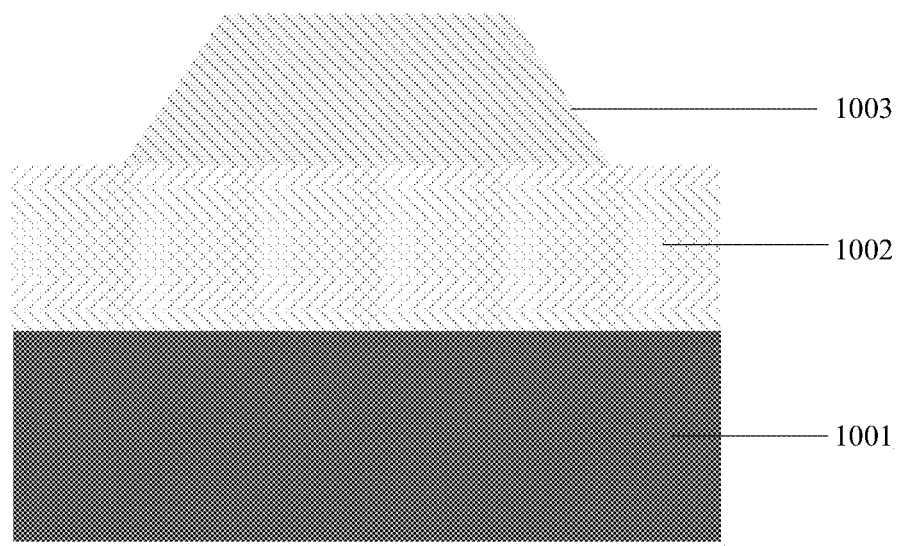
Figure 10E:
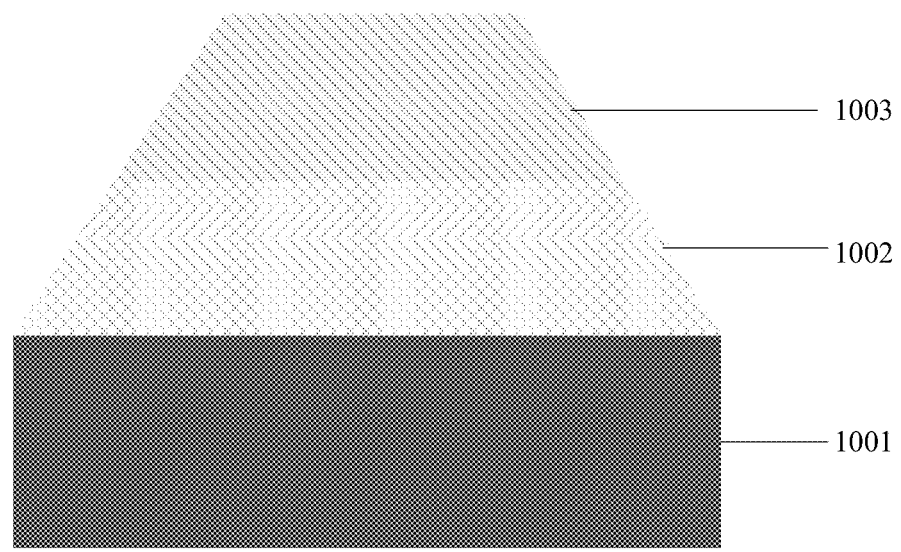
Figure 10F:
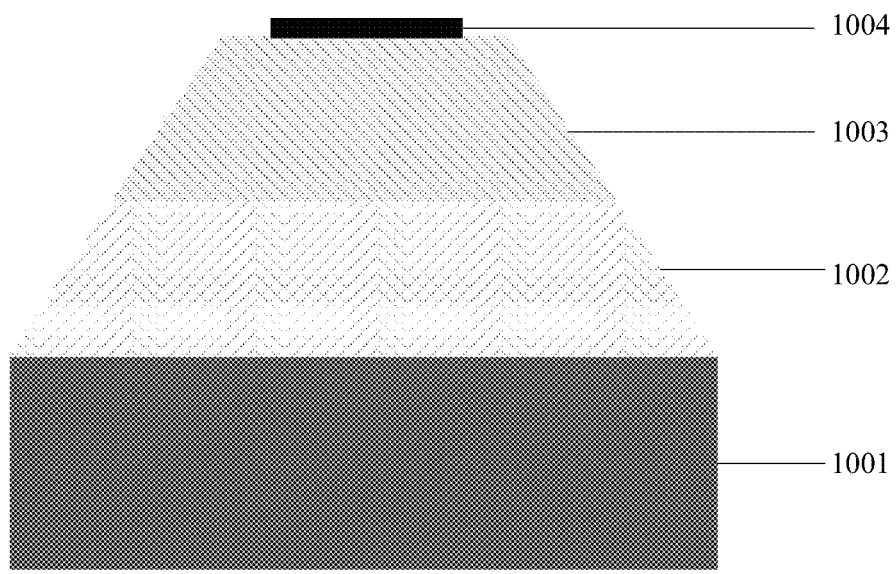
Figure 10G:
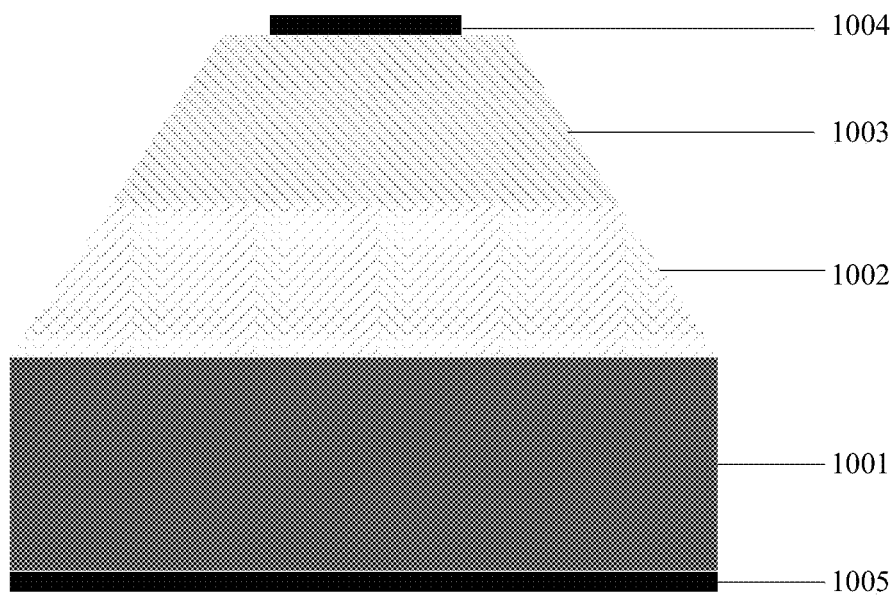
Figure 11A:
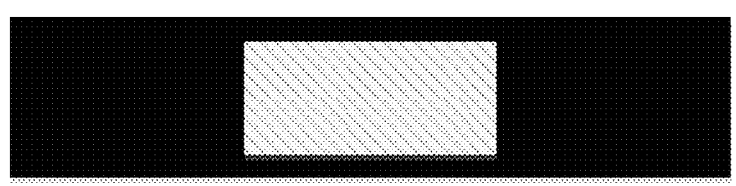
FIG. 11a is a schematic diagram of a third lithography mask according to an embodiment of the present disclosure.
Figure 11B:
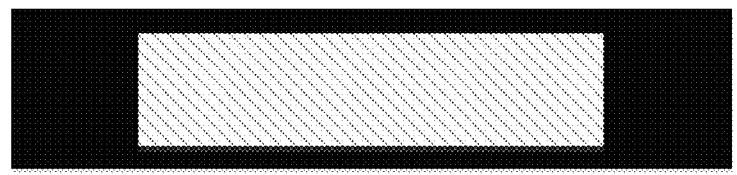
FIG. 11b is a schematic diagram of a fourth lithography mask according to an embodiment of the present disclosure.
Figure 11C:
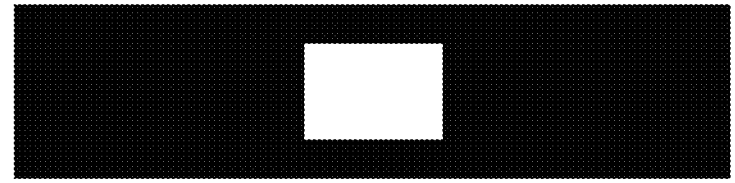
FIG. 11c is a schematic diagram of a fifth lithography mask according to an embodiment of the present disclosure.

Referring to FIG. 10a-10g, FIG. 11a, FIG. 11b and FIG. 11c, FIG. 10a-10g are schematic diagrams showing processes of a method for manufacturing a deep ultraviolet APD detector diode based on Ir$_2$O$_3$/Ga$_2$O$_3$ according to an embodiment of the present disclosure; FIG. 11a is a schematic diagram of a third lithography mask according to an embodiment of the present disclosure; FIG. 11b is a schematic diagram of a fourth lithography mask according to an embodiment of the present disclosure; and FIG. 11c is a schematic diagram of a fifth lithography mask according to an embodiment of the present disclosure. Based on the above embodiments, a method for manufacturing a deep ultraviolet APD detector diode based on Ir$_2$O$_3$/Ga$_2$O$_3$ according to the present disclosure is described in detail in this embodiment:

Step 1001: referring to FIG. 10a, a β-Ga$_2$O$_3$ substrate 1001 with a thickness of 200-600 μm is prepared and pre-cleaned.

Wherein, reasons for selecting β-Ga$_2$O$_3$ 1001 as the substrate are: β-Ga$_2$O$_3$ is a new generation of ultra-wide bandgap semiconductor materials with a band gap of 4.7-4.9 eV and has a theoretical breakdown field strength of 8 MV/cm, which is superior to SiC and GaN traditional wide bandgap materials. In addition, its single crystal substrate material can be obtained by a solution method, and the preparation cost is low. The β-Ga$_2$O$_3$ material itself is transparent and has a high light transmittance, therefore, the APD detector manufactured by Ga$_2$O$_3$ is more sensitive to deep ultraviolet (wavelength range at 200-280 nm) detection and the requirements for operating bias voltage is not high.

The substrate is firstly organically cleaned, wherein the first step is soaking in methanol for 3 minutes, the second step is soaking in acetone for 3 minutes, the third step is soaking in methanol for 3 minutes, the fourth step is cleaning by deionized water for 3 minutes, and the fifth step is cleaning by flowing deionized water for 5 minutes.

The substrate is acid cleaned, wherein the first step is soaking in deionized water and heat to 90° C., and the second step is preparing SPM solution by using deionized water:30% hydrogen peroxide:96% concentrated sulfuric acid=1:1:4, and immersing the substrate in the SPM solution for 5 minutes. Alternatively, the second step can be preparing Piranha solution by using a radio of 30% hydrogen peroxide:98% concentrated sulfuric acid=1:3, and immersing the substrate in Piranha solution for 1 min. Then the third step is soaking the substrate in deionized water and heated to 90° C., and then cooled it to the room temperature.

The substrate can be replaced by a 200-600 μm silicon substrate with 1 μm thermal oxidized SiO$_2$, but the above cleaning step is not required after the replacement, while a RCA standard cleaning is used. The insulating effect is deteriorated after the replacement, and the manufacturing process is more complicated.

Step 1002: referring to FIG. 10b, a N-type doped β-Ga$_2$O$_3$ material is grew on the β-Ga$_2$O$_3$ substrate 1001 prepared in step 1001 by molecular beam epitaxy to form a homoepitaxial layer 1002, wherein the doping element may be Sn or Si, Al, the doping concentration is on the order of 10$^{15}$ cm$^{-3}$ and the thickness of the homoepitaxial layer 1002 is 5-10 um.

Step 1003: referring to FIG. 10c, a P-type doped region Ir$_2$O$_3$ is grown on the N-type homoepitaxial layer 1002 prepared in Step 1002 by a CVD process to form a heteroepitaxial layer 1003, wherein the doping concentration is at the order of 10$^{19}$-10$^{20}$ cm$^{-3}$, and the thickness of the heteroepitaxial layer 1003 is 5-10 um.

Step 1004: referring to FIG. 10d and FIG. 11a, a trapezoidal structure is formed in the P-type hetero epitaxial layer 1003 by a tilt etching process, using a third photolithographic mask on the entire substrate surface formed in step 1003.

Step 1005: referring to FIG. 10e and FIG. 11b, a trapezoidal structure is formed in the N-type homoepitaxial layer 1002 by a selective tilt etching process, using a fourth photolithography mask on a surface of entire substrate formed in step 1004.

Specifically, the inclined etching process is a tilting mesa etching process, and the specific process is as follows: first, performing ICP dry etching to the surface of entire substrate for 5 seconds by using a BCl$_3$-based etching gas; then immersing it in a 5% HF solution for 10 s; performing the above steps alternatively until the material waited to be etched is completely removed.

Step 1006: referring to FIG. 10f and FIG. 11b, a top electrode Ti/Au is grown on the P-type hetero epitaxial layer 1003 prepared in step 1005 by magnetron sputtering, via a fifth photolithographic mask.

Specifically, Ni material with a mass percentage of >99.99% is used as a sputtering target, and Ar with a mass percentage of 99.999% is used as a sputtering gas to fill into the sputtering cavity. The chamber of the magnetron sputtering apparatus is cleaned with high purity Ar for 5 minutes before sputtering and then evacuated the chamber. A top electrode Ti is manufactured under the conditions that a vacuum is $6 \times 10^{-4}$-$1.3 \times 10^{-3}$ Pa, an Ar flow rate is 20-30 cm$^3$/s, a target base distance is 10 cm, and a working power is 100 W. The thickness of the top electrode Ti is 20-30 nm.

Au material with a mass percentage of >99.99% is used as a sputtering target, and Ar with a mass percentage of 99.999% is used as a sputtering gas to fill into the sputtering cavity. The chamber of the magnetron sputtering apparatus is cleaned with high purity Ar for 5 minutes before sputtering and then evacuated the chamber. A top electrode Au is manufactured under the conditions that a vacuum is $6 \times 10^{-4}$-$1.3 \times 10^{-3}$ Pa, an Ar flow rate is 20-30 cm$^3$/s, a target base distance is 10 cm, and a working power is 20-100 W. The thickness of the top electrode Au is 200-300 nm. Then, the top electrode Au is annealed under $N_2$ or Ar at 500° C. for 3 min to form an ohmic contact.

Step 1007: referring to FIG. 10g, a bottom electrode Ti/Au is grown on the lower surface of the substrate by magnetron sputtering.

Specifically, Ti material with a mass percentage >99.99% is used as a sputtering target, and Ar with a mass percentage of 99.999% is used as a sputtering gas in the sputtering cavity. The chamber of the magnetron sputtering apparatus is cleaned with high purity Ar for 5 minutes before sputtering and then evacuated the chamber. A gate electrode Ti is manufactured under the conditions that a vacuum is $6 \times 10^{-4}$-$1.3 \times 10^{-3}$ Pa, an Ar flow rate is 20-30 cm$^3$/s, a target base distance is 10 cm, and a working power is 100 W. The thickness of the gate electrode Ti is 20-30 nm.

Au material with a mass percentage of >99.99% is used as a sputtering target, and Ar with a mass percentage of 99.999% is used as a sputtering gas to fill into the sputtering cavity. The chamber of the magnetron sputtering apparatus is cleaned with high purity Ar for 5 minutes before sputtering and then evacuated the chamber. A gate electrode Au is manufactured under the conditions that a vacuum is $6 \times 10^{-4}$-$1.3 \times 10^{-3}$ Pa, an Ar flow rate is 20-30 cm$^3$/s, a target base distance is 10 cm, and a working power is 20-100 W. The thickness of the gate electrode Au is 200-300 nm. Then, the gate electrode Au is annealed under $N_2$ or Ar at 500° C. for 3 min to form an ohmic contact.

The ultraviolet APD detector of the disclosure adopts the $Ga_2O_3$ material with excellent optical performance for the first time, and it fully exerts the high light transmittance and transparency of the material in the deep ultraviolet region and the visible region. The light transmittance of the $Ga_2O_3$ material in the deep ultraviolet region can up to 80% and even more. In addition, the electrical properties of the $Ga_2O_3$ material can make sure that the novel ultraviolet APD detector of the present disclosure has a high withstand voltage and a high breakdown electric field, which far exceeds the high band gap of materials such as SiC and GaN, so that compared with the current APD detector, the novel ultraviolet APD detector of the present disclosure is more suitable for extreme environments such as high frequency, high radiation, high temperature and high pressure. In extreme environments, not only the reliability of the device is greatly improved, but also the detection performance is better than the current APD detector. In addition, the device structure of the novel ultraviolet APD detector of the present disclosure is improved on the basis of a conventional APD detector, that is, an avalanche photodiode, which can effectively increase the avalanche breakdown voltage and thereby increase the avalanche gain coefficient M. At the same time, M can be adjusted by adjusting the thickness of the N/P-type conductive $Ga_2O_3$ layer in the structure, and selecting an appropriate M makes the photodetector diode of the disclosure has a good signal-to-noise ratio and a low excess noise, so that the device can achieve the optimal photodetection sensitivity.

The above is only a preferred embodiment of the present disclosure, and is not intended to limit the scope of the disclosure. The disclosure has been disclosed in the above preferred embodiments, but is not intended to limit the present disclosure. Those skilled in the art can make some modifications or changes by using the technical content disclosed above, which can be known as equivalent embodiments of the present disclosure and without departing from the scope of the disclosure. Any simple modifications, equivalent changes and modifications made to the above embodiments in accordance with the technical spirit of the present disclosure are still within the scope of the technical solutions of the present disclosure.

INDUSTRIAL APPLICABILITY

In the embodiments of the present disclosure, by using $Ga_2O_3$ material in the structure of the photodetector, the extremely high light transmittance and transparency of the $Ga_2O_3$ material in the deep ultraviolet light region and the visible light region are fully exerted, and the device performance of the photodetector diode can be greatly improved.

What is claimed is:

1. A method for manufacturing an ultraviolet photodetector based on $Ga_2O_3$ material, comprising:
   selecting a substrate, wherein selecting a substrate comprises selecting a β-$Ga_2O_3$ material with a thickness of 200-600 μm as the substrate;
   forming a $Ga_2O_3$ layer on an upper surface of the substrate, wherein forming a $Ga_2O_3$ layer on an upper surface of the substrate comprises growing an N-type β-$Ga_2O_3$ material with a doping concentration of $1 \times 10^{15}$-$1 \times 10^{16}$ cm$^{-3}$ on the upper surface of the substrate by a molecular beam epitaxy process;
   forming a top electrode on the $Ga_2O_3$ layer; and
   forming a bottom electrode on a lower surface of the substrate.

2. The method according to claim 1, wherein after forming the $Ga_2O_3$ layer on the substrate, the method further comprises:
   growing a P-type $Ir_2O_3$ material with a doping concentration of $1 \times 10^{19}$-$1 \times 10^{20}$ cm$^{-3}$ on a surface of the $Ga_2O_3$ layer by a CVD process to form a $Ir_2O_3$ layer;
   etching the $Ir_2O_3$ layer by a inclined etching process to form a first trapezoidal structure in the $Ir_2O_3$ layer, via a first photolithography mask; and
   etching the $Ga_2O_3$ layer by a selective tilt etching process to form a second trapezoidal structure in the $Ga_2O_3$ layer, via a second photolithography mask.

3. The method according to claim 2, wherein forming the top electrode on the $Ga_2O_3$ layer, comprises:

sputtering a first composite metal material on the surface of the $Ga_2O_3$ layer by a magnetron sputtering process to form the top electrode, via a third photolithography mask.

4. A method for manufacturing an ultraviolet photodetector based on $Ga_2O_3$ material, comprising:
   selecting a substrate, wherein selecting a substrate comprises selecting a β-$Ga_2O_3$ material with a thickness of 200-600 μm as the substrate;
   forming a $Ga_2O_3$ layer on an upper surface of the substrate;
   forming a top electrode on the $Ga_2O_3$ layer; and
   forming a bottom electrode on a lower surface of the substrate;
   wherein forming a bottom electrode on a lower surface of the substrate comprises:
   sputtering on the lower surface of the β-$Ga_2O_3$ substrate to form a Ti layer under the conditions that a vacuum is $6\times10^{-4}$-$1.3\times10^{-3}$Pa and a working power is 100W, wherein Ti is used as a sputtering target, and Ar is used as a sputtering gas to fill into a sputtering chamber; and
   sputtering an Au layer on a surface of the Ti layer to form a second composite metal material and thereby forming the bottom electrode under the conditions that a vacuum is $6\times10^{-4}$-$1.3\times10^{-3}$Pa and a working power is 100W, wherein Au is used as a sputtering target, and Ar is used as a sputtering gas to fill into the sputtering chamber.

5. A method for manufacturing an ultraviolet photodetector based on $Ga_2O_3$ material, comprising:
   selecting a substrate;
   forming a $Ga_2O_3$ layer on an upper surface of the substrate;
   forming a top electrode on the $Ga_2O_3$ layer; and
   forming a bottom electrode on a lower surface of the substrate;
   wherein selecting a substrate comprises:
       selecting an N-type 4H-SiC or an N-type 6H-SiC material as the substrate; and
       cleaning the substrate according to an RCA standard cleaning process.

6. The method according to claim 5, before forming a $Ga_2O_3$ layer on the substrate, the method further comprises:
   growing an N-doped SiC material on the upper surface of the substrate by a LPCVD process to form an N-type homoepitaxial layer; and
   growing an N-doped GaN material on a surface of the homoepitaxial layer by an MOCVD process to form the GaN layer.

7. The method according to claim 6, wherein forming the $Ga_2O_3$ layer on the substrate comprises:
   growing a β-$Ga_2O_3$ material on a surface of the GaN layer by an MBE process to form a $Ga_2O_3$ layer.

8. The method according to claim 7, wherein after forming the $Ga_2O_3$ layer on the substrate, the method further comprises:
   sputtering a Ni material on a surface of the $Ga_2O_3$ layer to form a light absorbing layer under the conditions that a vacuum is $6\times10^{-4}$-$1.3\times10^{-3}$Pa and a working power is 100W, wherein Ti is used as a sputtering target, and Ar is used as a sputtering gas to fill into the sputtering chamber.

9. The method according to claim 8, wherein forming the top electrode on the $Ga_2O_3$ layer comprises:
   sputtering a Ni material on a surface of the $Ga_2O_3$ layer under the conditions that a vacuum is $6\times10^{-4}$-$1.3\times10^{-3}$Pa and a working power is 20-100W, wherein Ni is used as a sputtering target, and Ar is used as a sputtering gas to fill into the sputtering chamber; and
   sputtering an Au material on a surface of the Ni material to form a Ni/Au laminated bimetal material and thereby forming the top electrode under the conditions that a vacuum is $6\times10^{-4}$-$1.3\times10^{-3}$Pa and a working power is 20-100W, wherein Au is used as a sputtering target, and Ar is used as a sputtering gas to fill into the sputtering chamber.

10. The method according to claim 9, wherein forming the top electrode on the $Ga_2O_3$ layer further comprises:
    forming an ohmic contact at the junction between the $Ga_2O_3$ layer and the top electrode by a rapid thermal annealing process under an atmosphere of $N_2$ and Ar.

11. The method according to claim 8, wherein forming the bottom electrode on the lower surface of the substrate comprises:
    sputtering a Ni material on the lower surface of the substrate to form the bottom electrode under the conditions that a vacuum is $6\times10^{-4}$-$1.3\times10^{-3}$Pa and a working power is 100W, wherein Ni is used as a sputtering target, and Ar is used as a sputtering gas to fill into the sputtering chamber.

12. The method according to claim 11, wherein forming the bottom electrode on the lower surface of the substrate further comprises:
    forming an ohmic contact at the junction between the surface of the entire substrate and the bottom electrode by a rapid thermal annealing process under an atmosphere of $N_2$ and Ar.

\* \* \* \* \*